United States Patent [19]

Yabu et al.

[11] 4,455,194

[45] Jun. 19, 1984

[54] METHOD FOR PRODUCING A SEMICONDUCTOR DEVICE

[75] Inventors: Takashi Yabu, Yokohama; Masao Kanazawa, Kawasaki, both of Japan

[73] Assignee: Fujitsu Limited, Kawasaki, Japan

[21] Appl. No.: 476,264

[22] Filed: Mar. 17, 1983

[30] Foreign Application Priority Data

Mar. 18, 1982 [JP] Japan .................... 57-043746

[51] Int. Cl.³ .................. H01L 21/306; B44C 1/22; C03C 15/00; C23F 1/02
[52] U.S. Cl. ................... 156/653; 29/578; 29/580; 148/187; 156/643; 156/656; 156/657; 156/659.1; 156/662; 357/41; 357/49; 357/59; 427/88; 427/93; 430/317; 430/318
[58] Field of Search ............ 427/85, 86, 87, 88, 427/89, 90, 91, 93, 38, 39; 148/1.5, 187; 29/576 R, 578, 580, 591; 430/313, 316, 317, 318; 357/22, 23, 41, 49, 59, 71; 156/648, 643, 646, 653, 656, 657, 659.1, 661.1, 662, 644; 252/79.1

[56] References Cited

U.S. PATENT DOCUMENTS 4,420,504 12/1983 Cooper et al. ............... 156/653 X

OTHER PUBLICATIONS

End Programmable-Memory Directory, "Programmable Memory Choices Expand Design Options", by John Tsantes, Jan. 5, 1980, pp. 81-98.

IEEE Transactions on Electron Devices, "One-Device Cells for Dynamic Random-Access Memories" A Tutorial, by Rideout, vol. Ed 26, No. 6, 6/79, pp. 839-852.

IEEE Journal of Solid-State Circuits, "Laser Programmable Redundancy and Yield Improvement in a 64K DRAM", Smith et al., vol. SC-16, No. 5, 10/81, pp. 506-514.

Primary Examiner—William A. Powell
Attorney, Agent, or Firm—Staas & Halsey

[57] ABSTRACT

A method for producing a semiconductor device provided with a fuse including the steps of forming a fuse layer on an insulating layer formed on a semiconductor substrate, forming an interrupting layer covering the fuse layer and the insulating layer, forming an insulating protective layer covering the interrupting layer, selectively etching the protective layer, so as to form a window, with a suitable etchant which does not etch the interrupting layer, and etching the exposed interrupting layer to complete the window by which a portion of the the fuse layer and a portion of the insulating layer are exposed. The insulating layer is not removed so that the reliability of the semiconductor device will not deteriorate.

10 Claims, 12 Drawing Figures

METHOD FOR PRODUCING A SEMICONDUCTOR DEVICE

BACKGROUND OF THE INVENTION (1) Field of the Invention

The present invention relates to a method for producing a semiconductor device and more particularly to a process for forming fuses in an integrated circuit. The present invention can be suitably applied to form polycrystalline silicon fuses in a large-scale integration (LSI) memory.

(2) Description of the Prior Art

The total number of bits of a large capacity LSI memory, such as a 64K-bit dynamic random access memory, has been rapidly increased recently. In order to improve the yield, a redundancy organization is incorporated into the memory. The redundancy organization comprises spare rows and spare columns which are formed near a memory array. If a defective memory element (i.e., a defective bit) is generated, the row and the column forming the defective memory element are replaced with a spare (redundant) row and column. Replacement of the defective memory element is carried out by selectively blowing fuses (i.e., fusible links) which are provided in the memory device. The fuses are made of, e.g., polycrystalline silicon and are blown by an excess electric current or by irradiation with a laser beam.

The polycrystalline silicon fuses are formed around a memory array and in a LSI memory chip. One of the fuses is illustrated in FIGS. 1 and 2. As FIG. 1 shows, the fuse 1 comprises a narrow center portion 2 and wide end portions 3 and 4. The fuse 1 is formed by depositing a polycrystalline silicon layer on an insulating layer 5 of, e.g., silicon dioxide ($SiO_2$), formed on a semiconductor substrate 6 of, e.g., a silicon single crystalline wafer (FIG. 2) and selectively etching the polycrystalline silicon layer. Then an insulating layer 7, e.g., phosphosilicate glass (PSG), for insulating the polycrystalline silicon layer and a subsequently formed aluminum layer is formed on the fuse 1 and the insulating layer 5 (FIG. 2). Conductors 8 and 9 (FIG. 1) are formed by depositing a conductor layer, e.g., aluminum on the insulating layer 7 and selectively etching the conductor layer by means of a photo-etching method. The conductors 8 ad 9 are conected to the wide end portions 3 and 4, respectively, by way of through holes 10 and 11 formed in the insulating layer 7. A passivation layer 12, e.g., PSG, is formed on the whole surface of the obtained memory devices.

In order to easily and reliably blow the fuse 1, the passivation layer 12 and the insulating layer 7 are selectively etched to form a window 13 by which the narrow center portion 2 is exposed. In this case, since the $SiO_2$ of the insulating layer 5 is akin to the PSG of the layers 7 and 12, the $SiO_2$ layer 5 can be etched with an etchant used to etch the PSG layers 7 and 12. Furthermore, usually, the total thickness of the PSG layers 7 and 12 is about 2 $\mu$m and the thickness of the $SiO_2$ layer 5 is about 0.5 $\mu$m. Accordingly, during the formation of the window 13 by etching the PSG layers 7 and 12, the $SiO_2$ layer 5 can also be etched (as is shown in FIG. 2) so that a portion of the semiconductor substrate 6 may be exposed. If the semiconductor substrate 6 is exposed by the window 13, when the fuse 1 is blown, shortcircuiting may occur between the semiconductor substrate 6 and the blown fuse. When the $SiO_2$ layer 5 is thin, undesirable impurities, such as moisture and ions in the air, may penetrate into the semiconductor substrate 6 through the thin $SiO_2$ layer 5, with the result that the reliability of the LSI memory is decreased.

SUMMARY OF THE INVENTION

An object of the present invention is to eliminate the possibility of substrate exposure.

Another object of the present invention is to provide a method for producing a semiconductor device provided with fuses without excessively etching the insulating layer on the semiconductor substrate.

These and other objects of the present invention can be achieved by a method for producing a semiconductor device provided with fuses, which comprises the steps of forming a fuse layer on an insulating layer formed on a semiconductor substrate, forming an interrupting layer which interrupts the etching process and which covers the fuse layer and the insulating layer, forming an insulating protective layer covering the interrupting layer, selectively etching the insulating protective layer to form a preceding window, and selectively etching the interrupting layer to complete the window, by which a portion of the fuse layer and a portion of the insulating layer adjacent to the fuse layer portion are exposed.

According to the present invention, the interrupting layer is not etched with an etchant used to etch the insulating protective layer. If it is etched with an etchant used to etch the insulating protective layer, the etching rate of the interrupting layer is very slow.

The invention will become more apparent from the description of the preferred embodiments set forth below, with reference made to the accompanying drawings.

DESCRIPTION OF THE PREFERRED EMBODIMENTS

Referring to FIGS. 3 through 11, a process for forming a fuse in accordance with the present invention is explained in connection with a process for forming a one-transistor memory cell in an LSI memory. In this case, the one-transistor memory cell has a double-polysilicon structure which is well known to a person of ordinary skill in the art.

Figure 1:
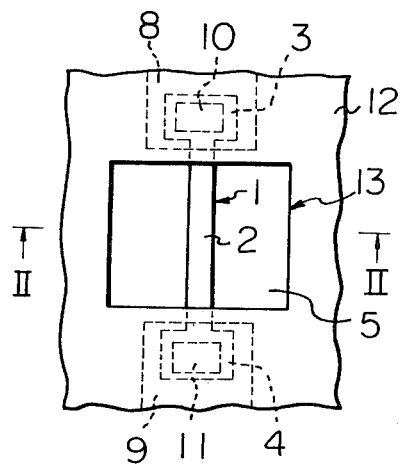
FIG. 1 a partial plan view of a semiconductor device provided with a fuse according to the prior art.
Figure 2:
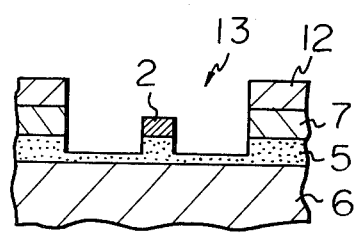
FIG. 2 is a sectional view along line II-II of FIG. 1.
Figure 3:
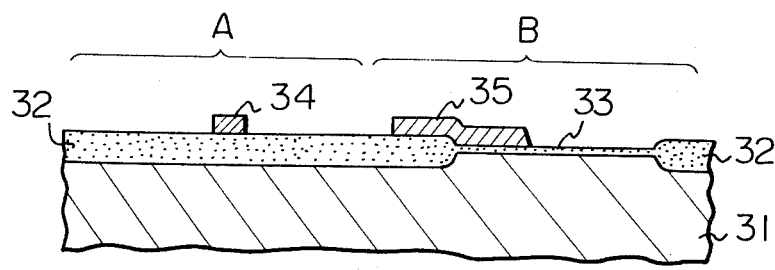
FIGS. 3 through 11 are sectional views of a semiconductor device, provided with a fuse and a one-transistor memory cell, in various stages of production by means of a method in accordance with the present invention.

In FIG. 3, "A" is the region in which a fuse is formed and "B" is the region in which a memory cell is formed. A silicon substrate 31 (i.e., a silicon single crystalline wafer) is selectively oxidized to form an insulating layer 32 of $SiO_2$ (i.e., a so-called field-insulating layer) having a thickness of, e.g., about 500 nm. Furthermore, the silicon substrate 31 is also selectively oxidized to form a thin insulating layer 33 of $SiO_2$ for a capacitor. Then a polycrystalline silicon layer having a thickness of from 300 nm to 500 nm is deposited on the whole surface of the insulating layers 32 and 33 by means of a chemical vapor deposition (CVD) method and selectively removed by means of a photoetching method to simultaneously form a fuse layer 34 in the region A and a capacitor electrode 35 in the region B.

Figure 4:
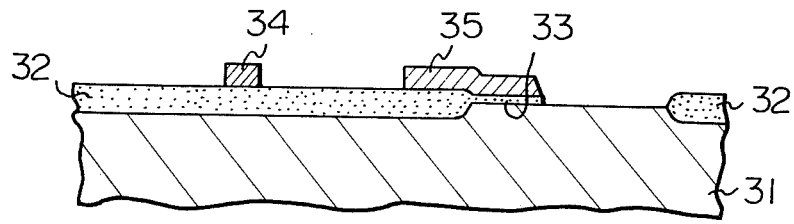
Figure 5:
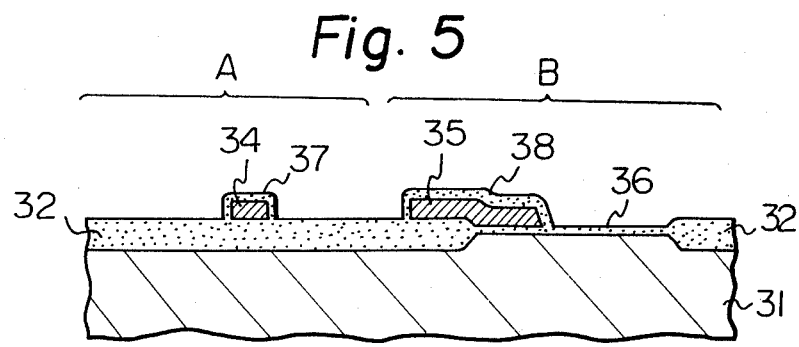

The exposed portion of the thin insulating layer 33 is also removed by means of a photo-etching method, as is shown in FIG. 4. then the exposed portion of the silicon substrate 31 is thermally oxidized to form a gate oxide ($SiO_2$) layer 36 having a thickness of, e.g., about 50 nm, as is shown in FIG. 5. At the same time, the fuse layer 34 and the capacitor electrode 35 of polycrystalline silicon are oxidized to form, respectively, $SiO_2$ insulating layers 37 and 38 having thicknesses of about 100 nm.

Figure 6:
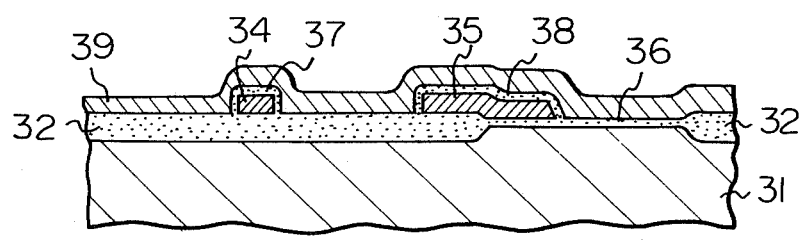
Figure 7:
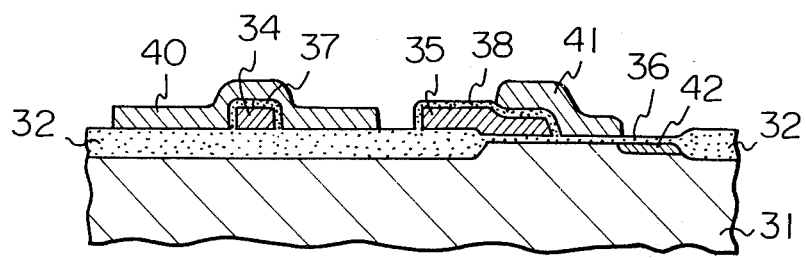

Then another polycrystalline silicon layer or interrupting layer 39 having a thickness from 300 nm to 500 nm is deposited on the whole surface of the $SiO_2$ layers 32, 36, 37, and 38 by means of a CVD method, as is shown in FIG. 6. The polycrystalline silicon layer 39 is selectively removed by means of a photo-etching method to simultaneously form a polycrystalline silicon island 40 in the region A and a gate electrode 41 in the region B, as is shown in FIG. 7. Then a doped region 42 (FIG. 7) is formed in the region B by implanting impurity ions in the silicon substrate 31 through the gate oxide layer 36.

Figure 8:
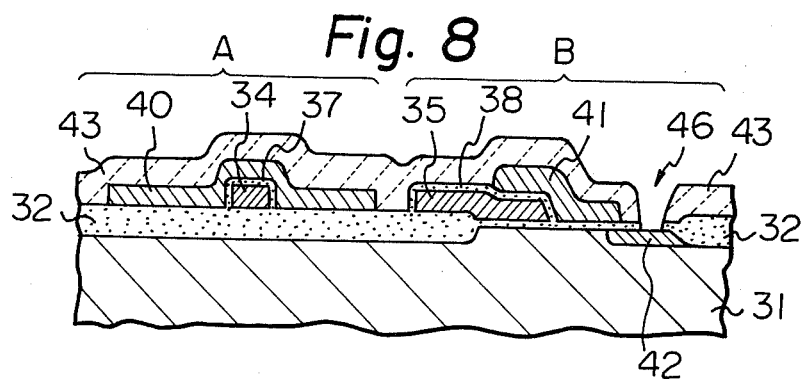

An isolation layer 43 of PSG having a thickness of, e.g., about 1 $\mu$m is deposited on the whole surface of the obtained LSI memory by means of a CVD method, as is shown in FIG. 8. The isolation layer 43 and the $SiO_2$ layers 37 and 36 are selectively removed by means of a photo-etching method to form contact holes 44 and 45 (FIG. 12) in the region A and a contact hole 46 (FIG. 8) in the region B. Accordingly, in the contact holes 44 and 45, wide end portions 47 and 48 of the fuse layer 34 are exposed, respectively, and in the contact hole 46 a portion of the silicon substrate 31 in the doped region 42 is exposed.

Figure 9:
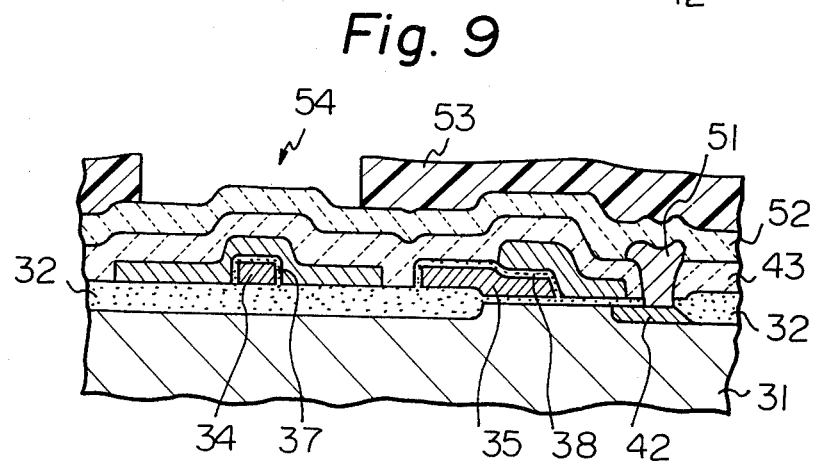

Then a conductor layer of, e.g., aluminum is formed on the isolation layer 43 and is patterned by means of a photo-etching method to form conductors 49 and 50 (FIG. 12) and an electrode 51 (FIG. 9). The conductors 49 and 50 are connected to the wide end portions 47 and 48 through the contact holes 44 and 45, respectively. The electrode 51 is connected to the doped region 42 through the contact hole 46. A passivation layer 52 (i.e., an insulating protective layer) of PSG having a thickness of, e.g., about 1 $\mu$m is deposited on the whole surface of the isolation layer 43, the conductors 47 and 48, and the electrode 51, as is shown in FIG. 9. A photoresist layer 53 is formed on the passivation layer 52, exposed to a patterned light, and developed to form an opening 54 in the region A, as is shown in FIG. 9. The dimensions of the opening 54 should be smaller than those of the polycrystalline silicon island 40.

Figure 10:
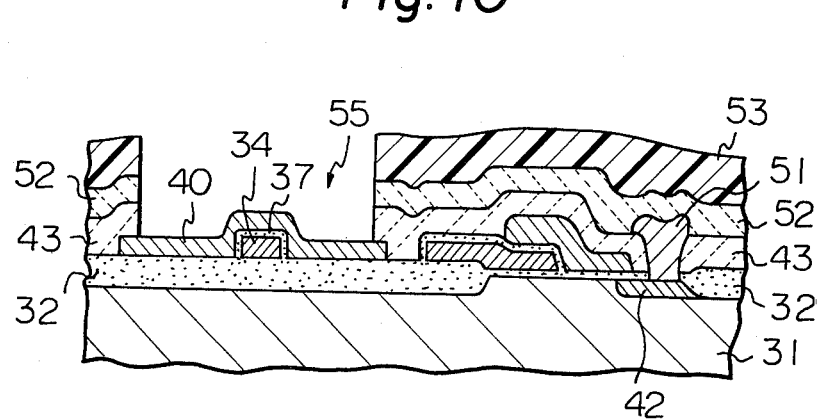
Figure 11:
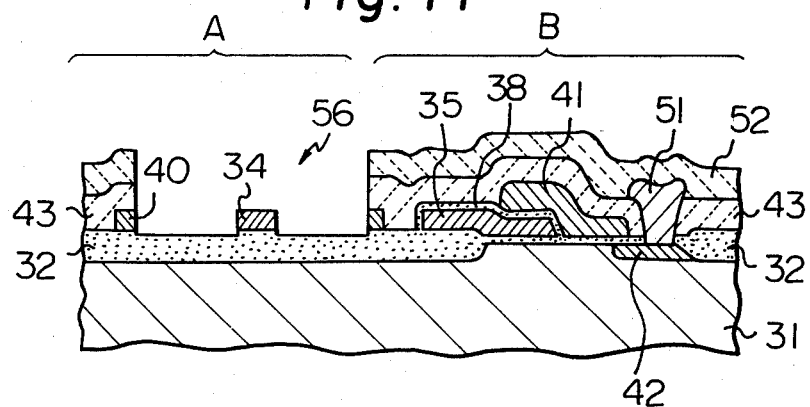
Figure 12:
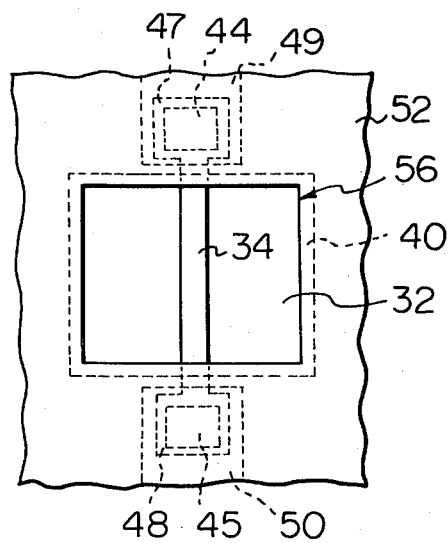
FIG. 12 is a plan view of a fuse of the semiconductor device shown in FIG. 11.

The passivation layer 52 and the isolation layer 43 of PSG are selectively removed by means of a dry-etching treatment using a trifluoromethane ($CHF_3$) gas as an etchant to form a preceding window 55, as is shown in FIG. 10. Since the polycrystalline silicon island 40 is not etched by the etchant, a portion of the island 40 is exposed by the preceding window 55 and prevents the etching step from proceeding further. Then the exposed portion of the polycrystalline silicon island 40 is removed by means of a dry-etching treatment using carbon tetrafluoride ($CF_4$) gas as an etchant so that an annular portion of the island 40 remains, as is shown in FIGS. 11 and 12. Next, the dry-etching treatment using the $CHF_3$ gas is repeated to remove the insulating layer 37 of $SiO_2$ so as to expose the fuse layer 34 by a window 56, as is shown FIG. 11. At the same time, the exposed portion of the insulating layer 32 is inevitably etched to the same thickness (about 100 nm) as that of the insulating layer 37. Since the thickness of the layer 37 is relatively thin, the time necessary for etching can be easily controlled, and it is possible to prevent excessive etching. Since the insulating layer 32 has a thickness of about 500 nm, a portion of the silicon substrate 31 under the layer 32 cannot be exposed. The above-mentioned three dry-etching treatments can be performed in a dry-etching apparatus by changing the etchant gas. During the etching treatments, the photoresist layer 53 is not removed. Later, the photoresist layer 53 is removed with a suitable solvent or by means of an ashing method. Thus, a fuse and a onetransistor memory cell are simultaneously formed, as is shown in FIG. 11, in accordance with the conventional steps for forming a double-polysilicon memory cell.

According to the present invention, the insulating layer 32, which is exposed by the window 56 and lies on the substrate 31, is not etched so that a thickness sufficient to prevent undesirable impurities from penetrating the layer is maintained, thus preventing the reliability of the LSI memory from deteriorating.

Upon a testing process for detecting defective elements, the obtained fuse can be blown by application of an electric current or irradiating with a laser beam thereon. After the fuse blowing operation, the window 56 is covered with PSG, if necessary.

It is possible to form the fuse without forming a memory cell.

The fuse layer can be made of a metal silicide, such as molybdenum silicide or tungsten silicide, instead of polycrystalline silicon. Another insulating layer can be made of PSG instead of $SiO_2$. It is possible to make the island 40 of a metal silicide (such as molybdenum silicide or tungsten silicide) or a metal (such as molybdenum, or tungsten) instead of polycrystalline silicon. Furthermore, it is possible to make the isolation layer and the passivation layer of $SiO_2$ instead of PSG.

It will be obvious that the present invention is not restricted to the above-mentioned embodiments and that many variations are possible for a person having ordinary skill in the art without departing from the scope of the invention.

We claim:

1. A method for producing a semiconductor device having a semiconductor substrate and an insulating layer formed on the semiconductor substrate, comprising the steps of:
   (a) forming a fuse layer on the insulating layer;
   (b) forming an interrupting layer on the fuse layer and the insulating layer, for interrupting an etching process;
   (c) forming an insulating protective layer on the interrupting layer;
   (d) selectively etching the insulating protective layer to form a preceding window; and
   (e) selectively etching the interrupting layer to complete the preceding window by which a portion of the fuse layer and a portion of the insulating layer adjacent to the fuse layer portion are exposed.

2. A method according to claim 1, further comprising the step of forming electrodes on the semiconductor device, wherein said step b) of forming the interrupting layer comprises forming a conductor layer for interconnecting the electrodes.

3. A method according to claim 2, further comprising the step of, after said step a) of forming the fuse layer, forming another insulating layer between the fuse layer and the interrupting layer.

4. A method according to claim 1, wherein said step b) of forming said interrupting layer comprises the substep of patterning the interrupting layer so that it has an island-like shape.

5. A method according to claim 2, wherein said step b) comprises forming the conductor layer of polycrystalline silicon.

6. A method according to claim 2, wherein said step b) comprises forming the conductor layer of a metal silicide.

7. A method for producing a semiconductor device having a semiconductor substrate and having a first insulating layer formed on the semiconductor substrate, comprising the steps of:
   (a) forming a polycrystalline silicon fuse layer on the first insulating layer;
   (b) forming a second insulating layer on the polycrystalline silicon fuse layer;
   (c) depositing a polycrystalline silicon layer on the second insulating layer;
   (d) patterning the polycrystalline silicon layer to form a patterned polycrystalline silicon layer over the polycrystalline silicon fuse layer;
   (e) forming an insulating protective layer covering the patterned polycrystalline silicon layer;
   (f) etching a portion of the insulating protective layer above the region in which the polycrystalline silicon fuse layer is formed;
   (g) etching the exposed portion of the polycrystalline silicon layer; and
   (h) etching the exposed portion of the insulating layer to expose a portion of the polycrystalline silicon fuse layer.

8. A method according to claim 4, wherein said substep of patterning the interrupting layer comprises forming the preceding window having dimensions smaller than the island-like shape.

9. A method according to claim 7, wherein said step a) comprises forming the polycrystalline fuse layer of a metal silicide.

10. A method according to claim 7, wherein said step a) comprises forming the polycrystalline fuse layer of polycrystalline silicon.

* * * * *

UNITED STATES PATENT AND TRADEMARK OFFICE
CERTIFICATE OF CORRECTION

PATENT NO.   :   4,455,194
DATED        :   JUNE 19, 1984
INVENTOR(S)  :   TAKASHI YABU ET AL.

It is certified that error appears in the above-identified patent and that said Letters Patent is hereby corrected as shown below:

```
Col. 1, line 44, "aluminum" should be --aluminum,--;
        line 46, "ad" should be --and--;
        line 47, "conected" should be --connected--.

Col. 4, line 17, "onetransistor" should be --one-transistor--
        line 34, after ".", continue with line 35.
```

Signed and Sealed this

Fourth Day of December 1984

[SEAL]

Attest:

GERALD J. MOSSINGHOFF

Attesting Officer    Commissioner of Patents and Trademarks